(12) United States Patent
Sun et al.

(10) Patent No.: US 12,040,408 B2
(45) Date of Patent: Jul. 16, 2024

(54) PRECURSOR SOLUTION OF INDIUM GALLIUM ZINC OXIDE FILM AND METHOD OF MANUFACTURING INDIUM GALLIUM ZINC OXIDE THIN FILM TRANSISTOR

(71) Applicant: SHENZHEN CHINA STAR OPTOELECTRONICS SEMICONDUCTOR DISPLAY TECHNOLOGY CO., LTD., Shenzhen (CN)

(72) Inventors: Hejing Sun, Shenzhen (CN); Hengda Qiu, Shenzhen (CN); Hang Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 829 days.

(21) Appl. No.: 17/057,053
(22) PCT Filed: Sep. 4, 2020
(86) PCT No.: PCT/CN2020/113481
§ 371 (c)(1),
(2) Date: Nov. 19, 2020
(87) PCT Pub. No.: WO2022/032766
PCT Pub. Date: Feb. 17, 2022

(65) Prior Publication Data
US 2022/0310844 A1   Sep. 29, 2022

(30) Foreign Application Priority Data
Aug. 11, 2020   (CN) .......................... 202010798884.5

(51) Int. Cl.
H01L 29/786   (2006.01)
C23C 14/08    (2006.01)
C23C 14/24    (2006.01)
H01L 29/66    (2006.01)

(52) U.S. Cl.
CPC .......... *H01L 29/7869* (2013.01); *C23C 14/08* (2013.01); *C23C 14/24* (2013.01); *H01L 29/66969* (2013.01); *H01L 29/786* (2013.01)

(58) Field of Classification Search
CPC ........... H01L 29/7869; H01L 29/66969; H01L 29/786; C23C 14/08; C23C 14/24
See application file for complete search history.

(56) References Cited

U.S. PATENT DOCUMENTS

2009/0211903 A1   8/2009 Lee
2012/0168747 A1   7/2012 Kim
2015/0123115 A1*  5/2015 Kim .................. H01L 21/02628
                                          257/43

FOREIGN PATENT DOCUMENTS

CN   102768945 A   11/2012
CN   104900709 A    9/2015
(Continued)

OTHER PUBLICATIONS

Zhang, Shi Yu Yu Zhi-Nong Cheng Jin Wu De-Long Li Xu-Yang Xue Wei "Effects of annealing temperature and Ga content on properties of solution-processed InGaZnO thin film" (2016) Acta Physica Sinica vol. 65, No. 12 (Year: 2016).*

(Continued)

*Primary Examiner* — David Vu
*Assistant Examiner* — Brandon C Fox
(74) *Attorney, Agent, or Firm* — PV IP PC; Wei Te Chung; Zhigang Ma

(57) ABSTRACT

The present disclosure provides a precursor solution of an indium gallium zinc oxide film and a method of preparing an indium gallium zinc oxide thin film transistor. The precursor solution is provided with an indium salt, a gallium salt, a zinc salt, a stabilizing agent, and a solvent. The stabilizing agent is ethanolamine. Use of ethanolamine helps to promote an oxidation process of the precursor solution, and reduce an oxygen vacancy concentration in the indium (Continued)

gallium zinc oxide film, so as to improve negative bias of a threshold voltage of a channel layer made of the indium gallium zinc oxide film in a thin film transistor.

9 Claims, 1 Drawing Sheet

(56) References Cited

FOREIGN PATENT DOCUMENTS

| | | | |
|---|---|---|---|
| CN | 106531612 A | 3/2017 | |
| CN | 109378274 A | 2/2019 | |
| CN | 109746019 A | 5/2019 | |

OTHER PUBLICATIONS

Name of author: Zhang, shiyu et al. Title of the article: Effects of Annealing Temperature and Ga Content on Properties of Solution-Processed InGaZnO Thin Film Title of the item: Acta Physica Sinica vol. 65, No. 12 date: May 31, 2016.

International Search Report in International application No. PCT/CN2020/113481, mailed on May 11, 2021.

Written Opinion of the International Searching Authority in International application No. PCT/CN2020/113481, mailed on May 11, 2021.

Chinese Office Action issued in corresponding Chinese Patent Application No. 202010798884.5 dated Jun. 4, 2021, pp. 1-7.

* cited by examiner

PRECURSOR SOLUTION OF INDIUM GALLIUM ZINC OXIDE FILM AND METHOD OF MANUFACTURING INDIUM GALLIUM ZINC OXIDE THIN FILM TRANSISTOR

RELATED APPLICATIONS

This application is a Notional Phase of PCT Patent Application No. PCT/CN2020/113481 having international filing date of Sep. 4, 2020, which claims the benefit of priority of Chinese Patent Application No. 202010798884.5 filed on Aug. 11, 2020. The contents of the above applications are all incorporated by reference as if fully set forth herein in their entirety.

FIELD OF INVENTION

The present disclosure relates to a semiconductor material technical field, and specifically, to a precursor solution of an indium gallium zinc oxide film and a method of manufacturing an indium gallium zinc oxide thin film transistor.

BACKGROUND OF INVENTION

Metal oxide semiconductors, represented by indium gallium zinc oxides (IGZO), are semiconductor materials with excellent performance. Compared with conventional amorphous silicon, indium gallium zinc oxides of metal oxide materials have excellent properties such as high electron mobility, satisfactory isotropy, and high light transmittance, and therefore are expected to be used in a panel display field.

A solution method for preparing oxide films is a desirable way to reduce cost of coating. However, it is difficult to stably obtain devices with consistent performance from the formulation of a precursor solution of the oxides. In addition, an excessive carrier concentration inside the film may cause negative bias of a threshold voltage in a thin film transistor (TFT).

SUMMARY OF DISCLOSURE

Technical Problem

An object of the present disclosure is to provide a precursor solution of an indium gallium zinc oxide film and a method of manufacturing an indium gallium zinc oxide thin film transistor (IGZO-TFT) to solve a problem of negative bias of threshold voltages resulting from excessive carrier concentration inside the indium gallium zinc oxide film, thereby improving the negative bias of threshold voltages of a thin film transistor having a channel layer made of an indium gallium zinc oxide, so that the indium gallium zinc oxide thin film transistor has a threshold voltage closer to zero.

Technical Solutions

In a first aspect, the present invention provides a precursor solution of an indium gallium zinc oxide film, comprising an indium salt, a gallium salt, a zinc salt, a stabilizing agent, and a solvent; wherein the stabilizing agent is ethanolamine; the solvent is 2-methoxyethanol or water; a mass concentration of the ethanolamine in the precursor solution ranges from 4 to 20 mg/ml; and a molar ratio of an indium ion, a gallium ion, and a zinc ion in the precursor solution is (6-7):1:(2-3).

Preferably, the mass concentration of the ethanolamine in the precursor solution ranges from 6 to 18 mg/ml.

Preferably, the molar ratio of the indium ion, the gallium ion, and the zinc ion in the precursor solution is 7:1:2.

Preferably, the indium salt is selected from a group consisting of indium nitrate, indium acetate, and indium chloride; the gallium salt is selected from a group consisting of gallium nitrate, gallium acetate, and gallium chloride; and the zinc salt is selected from a group consisting of zinc nitrate, zinc acetate, and zinc chloride.

More preferably, the indium salt, the gallium salt, and the zinc salt are nitrates.

In a second aspect, the present disclosure provides a precursor solution of the indium gallium zinc oxide film, comprising an indium salt, a gallium salt, a zinc salt, a stabilizing agent, and a solvent; wherein the stabilizing agent is ethanolamine.

Preferably, a mass concentration of the ethanolamine in the precursor solution ranges from 4 to 20 mg/ml. More preferably, the mass concentration of the ethanolamine in the precursor solution is 6 to 18 mg/ml.

Preferably, a molar ratio of an indium ion, a gallium ion, and a zinc ion in the precursor solution is (6-7):1:(2-3). Most preferably, the molar ratio of the indium ion, the gallium ion, and the zinc ion in the precursor solution is 7:1:2.

Preferably, the solvent is 2-methoxyethanol or deionized water.

In a third aspect, the present disclosure further provides a method of manufacturing an indium gallium zinc oxide thin film transistor, comprising following steps of:
(1) preparing the abovementioned precursor solution of an indium gallium zinc oxide film;
(2) evenly applying the precursor solution on a substrate with a surface pretreatment, and sequentially pre-baking and annealing to obtain an indium gallium zinc oxide film;
(3) patterning the indium gallium zinc oxide film to obtain a patterned indium gallium zinc oxide film; and
(4) forming a source-drain electrode on the patterned indium gallium zinc oxide film to obtain the indium gallium zinc oxide thin film transistor.

Preferably, the step (1) of preparing the precursor solution comprises steps of preparing a mixture of an indium salt, a gallium salt, and a zinc salt according to a molar ratio of an indium ion, a gallium ion, and a zinc ion; adding ethanolamine into the mixture according to a mass concentration of the ethanolamine; and standing still after completely mixing.

Preferably, the step (2) of applying is performed by spin-coating, specifically, by dropping 10-15 microliters of the precursor solution per square centimeter on the substrate; after spin-coating at 300-700 revolutions per minute for 3-5 seconds, accelerating to 2500-4500 revolutions per minute and then spin-coating for 30-50 seconds; conditions of pre-baking are baking at 100-120° C. for 5-10 minutes; and conditions of annealing are thermal treatment at 350-500° C. for 40-60 minutes.

Preferably, in the step (3), the patterned indium gallium zinc oxide film has a thickness ranging from 20 to 30 nm.

Preferably, the step (3) of patterning comprises steps of evenly applying a photoresist on the indium gallium zinc oxide film, and then sequentially pre-baking, masking, exposing, first annealing, developing, etching, washing, removing the photoresist, and second annealing; wherein the step of applying is performed by spinning-coating, specifically, by dropping the photoresist on an entire surface of the indium gallium zinc oxide film; after spin-coating at 500-

700 revolutions per minutes for 4-8 seconds, accelerating to 3500-4500 revolutions per minute and then spin-coating for 35-50 seconds; conditions of pre-baking are baking at 145-150° C. for 65-75 seconds; the step of exposing is performed by irradiating under ultraviolet ray for 24-26 seconds; the time of developing is 13-18 seconds; conditions of the first annealing are thermal treatment at 90-100° C. for 60-70 seconds; and conditions of the second annealing are thermal treatment at 350-450° C. for 40-60 minutes.

Preferably, the step (4) of preparing the source-drain electrode is performed by aligning and attaching a metal mask having a pattern of the source-drain electrode to the patterned indium gallium zinc oxide film, and a metal film is formed by vacuum evaporation at a rate of 2-15 Å/s under $9.9 \times 10^{-4}$ to $9.9 \times 10^{-3}$ pascals. More preferably, the metal film is an aluminum film. The metal film has a thickness preferably ranging from 80 to 120 nm.

Beneficial Effect:

Compared with the prior art, the use of ethanolamine in the present disclosure may promote the oxidation process of preparing indium gallium zinc oxide semiconductor films by using the precursor solution in the annealing process at high temperature, and reduce the oxygen vacancy concentration in the material, so as to the improve negative bias of the threshold voltage in the thin film transistor. To a certain extent, a subthreshold swing and an electron mobility of the thin film transistor are also improved, so that the performance of the thin film transistor is significantly improved. In addition, the manufacturing process of the thin film transistor is simple and conductive to reducing the manufacturing costs in the production applications.

In order to make the above descriptions more clearly understandable, the preferred embodiments of the present disclosure accompanying with the drawings will be detail described hereinafter.

DETAILED DESCRIPTION OF PREFERRED EMBODIMENTS

Figure 1:
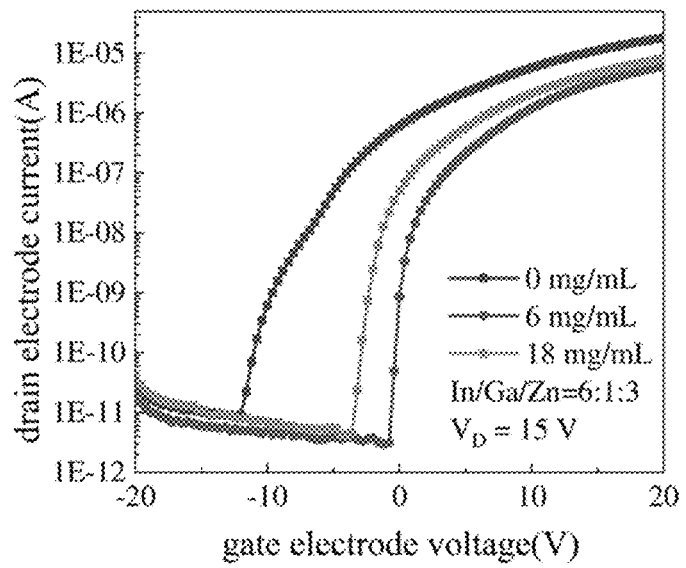
FIG. 1 is a transfer characteristic curve of an indium gallium zinc oxide thin film transistor prepared by adding different amount of ethanolamine into a mixture with a molar ratio of an indium ion, a gallium ion, and a zinc ion in the precursor solution that is 6:1:3.

The technical solutions in embodiments of the present disclosure will be described clearly and completely in conjunction with the drawings in the embodiments of the present disclosure. Apparently, the described embodiments are only a part of the embodiments of the present disclosure, but not all of the embodiments. Based on the embodiments in the present disclosure, other embodiments obtained by those skilled in the art without creative work would fall within the protection scope of the present disclosure.

In the description of this disclosure, the term "including" means "including but not limited to". The terms "first", "second", and "third" are only used as signs and do not impose numerical requirements or establish order. Various embodiments of the present disclosure may exist in a range form. It should be understood that the description in a range form is merely for convenience and brevity, which should not be construed as a rigid limit to the scope of the present disclosure. Therefore, it should be considered that the stated range description has specifically disclosed all possible subranges and a single value within the range. For example, it should be considered that a range description from 1 to 6 has disclosed subranges such as from 1 to 3, 1 to 4, 1 to 5, 2 to 4, 2 to 6, or 3 to 6, and a single number within the range such as 1, 2, 3, 4, 5, and 6, and this applies to any range. Additionally, when a numerical range is indicated in this article, it is meant to include any quoted number within the indicated range (fraction or integer).

One embodiment of the present disclosure provides a precursor solution of an indium gallium zinc oxide film, comprising an indium salt, a gallium salt, a zinc salt, a stabilizing agent, and a solvent; wherein the stabilizing agent is ethanolamine; the solvent is 2-methoxyethanol or water; a mass concentration of the ethanolamine in the precursor solution ranges from 4 to 20 mg/ml, and a molar ratio of an indium ion, a gallium ion, and a zinc ion in the precursor solution is (6-7):1:(2-3).

In this embodiment, the mass concentration of the ethanolamine in the precursor solution ranges from 6 to 18 mg/ml. It should be understood that the mass concentration of the ethanolamine may be any value within the abovementioned range, for example, an integer value of 4, 5, 6, 7, 8, 9, 10, 11, 12, 13, 14, 15, 16, 17, 18, 19, or 20. A further example is a non-integer value within the abovementioned range, such as 4.5, 5.5, 6.5, 7.5, 8.5, 9.5, 10.5, 11.5, 12.5, 13.5, 14.5, 15.5, 16.5, 17.5, 18.5, or 19.5. In this embodiment, the molar ratio of an indium ion, a gallium ion, and a zinc ion in the precursor solution may be (6-7):1:(2-3). It should be understood that the molar ratio may be any value within the abovementioned range, such as 6:1:2, 6:1:2.5, 6:1:3, 7:1:2, 7:1:2.5, 7:1:3, 6.5:1:2, or 6.5:1:3. Under the above molar ratio of the ethanolamine, the indium ion, the gallium ion, and the zinc ion, the mobility and the turn-on current of the thin film transistor may be improved, and the serious negative bias of the threshold voltage can be avoided. The dissolution of the indium salt and the gallium salt may be accelerated, and the film formation properties of the solution may be improved by using 2-methoxyethanol as the solvent of the precursor solution.

In one embodiment of the present disclosure, the mass concentration of the ethanolamine in the precursor solution ranges from 6 to 18 mg/ml. It should be understood that the mass concentration of the ethanolamine may be any value within the range, such as integer values 6, 7, 8, 9, 10, 11, 12, 13, 14, 15, 16, 17, or 18 within the range, and non-integer values such as 6.5, 7.5, 8.5, 9.5, 10.5, 11.5, 12.5, 13.5, 14.5, 15.5, 16.5, or 17.5 within the range.

In one embodiment of the present disclosure, the molar ratio of the indium ion, the gallium ion, and the zinc ion in the precursor solution is 7:1:2.

In one embodiment of the present disclosure, the indium salt is selected from a group consisting of indium nitrate, indium acetate, and indium chloride; the gallium salt is selected from a group consisting of gallium nitrate, gallium acetate, and gallium chloride; and the zinc salt is selected from zinc nitrate, zinc acetate, and zinc chloride.

In one embodiment of the present disclosure, the indium salt, the gallium salt, and the zinc salt are nitrates. By using the nitrates of the indium salt, the gallium salt, and the zinc salt to prepare the precursor solution, compared with acetates and chloride salts, the annealing temperature may be lower during the manufacturing process of using the precursor solution to prepare the thin film transistor, and the obtained thin film transistor has a better electron mobility.

One embodiment of the present disclosure further provides a precursor solution of the indium gallium zinc oxide film, comprising an indium salt, a gallium salt, a zinc salt, a stabilizing agent, and a solvent; wherein the stabilizing agent is ethanolamine.

In one embodiment of the present disclosure, the precursor solution merely consists of the indium salt, the gallium salt, the zinc salt, the stabilizing agent, and the solvent; wherein the stabilizing agent is ethanolamine.

In the present disclosure, the use of ethanolamine may promote the oxidation process of preparing indium gallium zinc oxide semiconductor films by using the precursor solution in the annealing process at high temperature, and reduce the oxygen vacancy concentration in the material, so as to the improve negative bias of the threshold voltage in the thin film transistor. To a certain extent, a subthreshold swing and an electron mobility of the thin film transistor are also improved, so that the performance of the thin film transistor is significantly improved. In addition, the manufacturing process of the thin film transistor is simple and conductive to reducing the manufacturing costs in the production applications.

In one embodiment of the present disclosure, a mass concentration of the ethanolamine in the precursor solution ranges from 4 to 20 mg/ml. It should be understood that the mass concentration of the ethanolamine may be any value within the range, such as integer values 4, 5, 6, 7, 8, 9, 10, 11, 12, 13, 14, 15, 16, 17, 18, 19, or 20, and non-integer values such as 4.5, 5.5, 6.5, 7.5, 8.5, 9.5, 10.5, 11.5, 12.5, 13.5, 14.5, 15.5, 16.5, 17.5, 18.5, or 19.5 within the range. It is characterized that the mass concentration of the ethanolamine in the precursor solution is preferably 6-18 mg/ml.

In one embodiment of the present disclosure, the indium salt may be indium nitrate, indium acetate, or indium chloride; the gallium salt may be gallium nitrate, gallium acetate, or gallium chloride; and the zinc salt may be zinc nitrate, zinc acetate, or zinc chloride. It is characterized that the indium salt, the gallium salt, and the zinc salt are preferably nitrates, such as indium nitrate hydrate (In(NO$_3$)$_3$·xH$_2$O), gallium nitrate hydrate (Ga(NO$_3$)$_3$·xH$_2$O), and zinc nitrate hydrate (Zn(NO$_3$)$_2$·xH$_2$O). By using the nitrates of the indium salt, the gallium salt, and the zinc salt to prepare the precursor solution, compared with acetates and chloride salts, the annealing temperature may be lower during the manufacturing process of using the precursor solution to prepare the thin film transistor, and the obtained thin film transistor has a better electron mobility.

In one embodiment of the present disclosure, the molar ratio of an indium ion, a gallium ion, and a zinc ion in the precursor solution may be (6-7):1:(2-3). It should be understood that the molar ratio may be any value within the abovementioned range, such as 6:1:2, 6:1:2.5, 6:1:3, 7:1:2, 7:1:2.5, 7:1:3, 6.5:1:2, or 6.5:1:3. Under the premise of the presence of ethanolamine and the above molar ratio of the indium ion, the gallium ion, and the zinc ion, the mobility and the turn-on current of the thin film transistor may be improved, and the serious negative bias of the threshold voltage can be avoided.

In one embodiment of the present disclosure, the solvent may be 2-methoxyethanol or deionized water. It is characterized that the dissolution of the gallium salt may be accelerated and the film formation properties of the solution may be improved by using 2-methoxyethanol as the solvent of the precursor solution.

In a third aspect, one embodiment of the present disclosure further provides a method of manufacturing an indium gallium zinc oxide thin film transistor by using the precursor solution, comprising steps of:
(1) preparing the abovementioned precursor solution of an indium gallium zinc oxide film;
(2) evenly applying the precursor solution on a substrate with a surface pretreatment, and sequentially pre-baking and annealing to obtain an indium gallium zinc oxide film;
(3) patterning the indium gallium zinc oxide film to obtain a patterned indium gallium zinc oxide film; and
(4) forming a source-drain electrode on the patterned indium gallium zinc oxide film to obtain the indium gallium zinc oxide thin film transistor.

In one embodiment of the present disclosure, the step (1) of preparing the precursor solution comprises steps of preparing a mixture of an indium salt, a gallium salt, and a zinc salt according to a predetermined molar ratio of an indium ion, a gallium ion to, and a zinc ion; adding ethanolamine into the mixture according to a predetermined mass concentration of the ethanolamine; and standing still after completely mixing. For example, method and conditions of mixing comprise steps of stirring with a stir bar at room temperature for 3 hours; and standing still for 24 hours.

In one embodiment of the present disclosure, in the step (2), the substrate may be a silica or glass substrate, and specially, be a p-type heavily doped silica chip.

In one embodiment of the present disclosure, the step (2) of applying is performed by spin-coating, specifically, by dropping 10-15 microliters of the precursor solution per square centimeter on the substrate; after spin-coating at 300-700 revolutions per minute for 3-5 seconds; accelerating to 2500-4500 revolutions per minute and then spin-coating for 30-50 seconds; conditions of pre-baking are baking at 100-120° C. for 5-10 minutes; and conditions of annealing are thermal treatment at 350-500° C. for 40-60 minutes. It should be understood that all the above parameters may be any value within the corresponding range, and they may be integer values or non-integer values. For example, the step of applying is performed by spin-coating, specifically, by dropping 10, 10.5, 11, 11.5, 12, 12.5, 13, 13.5, 14, 14.5, or 15 microliters of the precursor solution per square centimeter on the substrate; after spin-coating at 300, 400, 500, 600, or 700 revolutions per minute for 3, 3.5, 4, 4.5, or 5 seconds; accelerating to 2500, 3000, 3500, 4000, or 4500 revolutions per minute and then spin-coating for 30, 40, or 50 seconds; conditions of pre-baking are baking at 100, 110, or 120° C. for 5, 6, 7, 8, 9, or 10 minutes; and conditions of annealing are thermal treatment at 350, 400, 450, or 500° C. for 40, 50, or 60 minutes. The above specific values are merely illustrative and not all listed, and other unlisted values are also within the protection scope of the present disclosure. The thin film transistors prepared under the above conditions have better performance.

In one embodiment of the present disclosure, in the step (3), the step of patterning may be performed by using a negative photoresist or a positive photoresist with their own corresponding masks.

In one embodiment of the present disclosure, in the step (3), the patterned indium gallium zinc oxide film has a thickness ranging from 20 to 30 nm. It should be understood that the thickness may be any value within the range, such as 20, 20.5, 21, 21.5, 22, 22.5, 23, 23.5, 24, 24.5, 25, 25.5, 26, 26.5, 27, 27.5, 28, 28.5, 29, 29.5, or 30. An indium gallium zinc oxide semiconductor film having the thickness within the range can realize a satisfactory film coating morphology and satisfactory TFT electrical properties.

In one embodiment of the present disclosure, the step (3) of patterning comprises steps of evenly applying a photoresist on the indium gallium zinc oxide film, and then sequentially pre-baking, masking, exposing, first annealing, developing, etching, washing, removing the photoresist, and second annealing; wherein the step of applying is performed by spinning-coating, specifically, by dropping the photoresist on an entire surface of the indium gallium zinc oxide film; after spin-coating at 500-700 revolutions per minutes for 4-8 seconds, accelerating to 3500-4500 revolutions per minute and then spin-coating for 35-50 seconds; conditions of pre-baking are baking at 145-150° C. for 65-75 seconds; the step of exposing is performed by irradiating under ultraviolet ray for 24-26 seconds; the time of developing is 13-18 seconds; conditions of the first annealing are thermal treatment at 90-100° C. for 60-70 seconds; and conditions of the second annealing are thermal treatment at 350-450° C. for 40-60 minutes. It should be understood that all above parameters may be any value within the corresponding range, and they may be integer values or non-integer values. For example, the step of applying is performed by spin-coating, specifically, by dropping the photoresist on an entire surface of the indium gallium zinc oxide film; after spin-coating at 500, 600, or 700 revolutions per minutes for 4, 5, 6, 7, or 8 seconds, accelerating to 3500, 4000, or 4500 revolutions per minute and then spin-coating for 35, 40, 45, or 50 seconds; conditions of pre-baking are baking at 145, 146, 147, 148, 149, or 150° C. for 65, 70, or 75 seconds; the step of exposing is performed by irradiating under ultraviolet ray for 24, 25, or 26 seconds; the time of developing is 13, 14, 15, 16, 17, or 18 seconds; conditions of the first annealing are thermal treatment at 90, 92, 94, 96, 98, or 100° C. for 60, 65, or 70 seconds; and conditions of the second annealing are thermal treatment at 350, 400, or 450° C. for 40, 45, 50, 55, or 60 minutes. The above specific values are merely illustrative and not all listed, and other unlisted values are also within the protection scope of the present disclosure. The thin film transistors prepared under the above conditions have better performance.

In one embodiment of the present disclosure, the step of etching may be performed by dry-etching or wet-etching, and preferably by wet-etching. The wet-etching can reduce process time and the process cost is low. 3.4% mass concentration of an oxalic acid aqueous solution is preferred to be used for wet-etching. The oxalic acid aqueous solution has a higher etching rate than the hydrochloric acid aqueous solution, and the process time is shorter.

In one embodiment of the present disclosure, the step (4) of preparing the source-drain electrode is performed by aligning and attaching a metal mask having a pattern of the source-drain electrode to the patterned indium gallium zinc oxide film, and a metal film is formed by vacuum evaporation at a rate of 2-15 Å/s under $9.9 \times 10^{-4}$ to $9.9 \times 10^{-3}$ pascals. It should be understood that all above parameters may be any value within the corresponding range, and they may be integer values or non-integer values. For example, the metal film is formed by vacuum evaporation at a rate of 2, 4, 6, 8, 10, 12, 14, or 15 Å/s under $9.9 \times 10^{-4}$ or $9.9 \times 10^{-3}$ pascals.

In one embodiment of the present disclosure, the metal film may be an aluminum film.

In one embodiment of the present disclosure, the metal film has a thickness preferably ranging from 80 to 120 nm. It should understood that the thickness may be any value within the range, such as 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, or 120. A further example is to obtain non-integer values within 80 to 100 nm, such as 80.5, 81.5, 82.5, 83.5, 84.5, 85.5, 86.5, 87.5, 88.5, 89.5, 90.5, 91.5, 92.5, 93.5, 94.5, 95.5, 96.5, 97.5, 98.5, 99.5, 100.5, 101.5, 102.5, 103.5, 104.5, 105.5, 106.5, 107.5, 108.5, 109.5, 110.5, 111.5, 112.5, 113.5, 114.5, 115.5, 116.5, 117.5, 118.5, or 119.5. The thickness within the range can bring better electrical properties for the thin film transistor.

The indium gallium zinc oxide metal oxide semiconductor material of the present disclosure can be applied to thin film transistors in flat panel display applications.

The objectives, technical solutions and beneficial effects of the present disclosure will be further described in detail below with reference to specific examples.

The reagents used in the following specific examples are all commercially available. In below examples, the reagents include 2-methoxyethanol (anhydrous, 99.8%, Sigma-Aldrich), indium(III) nitrate hydrate (99.9% trace metals basis), gallium(III) nitrate hydrate (crystalline, 99.9% trace metal basis), and zinc(II) nitrate hydrate (99.999% trace metal basis). The following solvents such as acetone and alcohol are both analytical reagents (AR).

Example 1

This embodiment provides a precursor solution of an indium gallium zinc oxide film, comprising an indium salt, a gallium salt, a zinc salt, a stabilizing agent, and a solvent; wherein the indium salt is indium nitrate hydrate ($In(NO_3)_3 \cdot 3H_2O$); the gallium salt is gallium nitrate hydrate ($Ga(NO_3)_3 \cdot 3H_2O$); the zinc salt is zinc nitrate hydrate ($Zn(NO_3)_2 \cdot 2H_2O$), the stabilizing agent is ethanolamine (MEA); a mass concentration of the ethanolamine in the precursor solution is 18 mg/ml, a molar ratio of the indium ion, gallium ion, and the zinc ion in the precursor solution is 6:1:3; and the solvent is 2-methoxyethanol (may also be water).

This embodiment further provides a method of preparing an indium gallium zinc oxide thin film transistor by using the abovementioned precursor solution, comprising the following steps:

(1) preparing the abovementioned precursor solution of an indium gallium zinc oxide film.

Specific method comprises steps of: dissolving indium nitrate hydrate ($In(NO_3)_3 \cdot xH_2O$), gallium nitrate hydrate ($Ga(NO_3)_3 \cdot xH_2O$), and zinc nitrate hydrate ($Zn(NO_3)_2 \cdot xH_2O$) in 2-methoxyethanol, respectively, to prepare solutions having a mass concentration of 0.3 mol/ml; using a magnetic stir bar to stir at room temperature for 3 hours to fully dissolve the nitrates; mixing the indium nitrate solution, the gallium nitrate solution, and the zinc nitrate solution according to a volume ratio of 6:1:3, so that the molar ratio of the indium ion, the gallium ion, and the zinc ion is In:Ga:Zn=6:1:3; and then adding the ethanolamine into the precursor solution to allow the mass concentration of the ethanolamine to reach 18 mg/ml, using the magnetic stir bar to stir at room temperature for 3 hours for completely mixing, and standing still for 24 hours.

(2) evenly applying the precursor solution on a substrate with a surface pretreatment, and sequentially pre-baking and annealing to obtain an indium gallium zinc oxide film.

Specific method comprises steps of: using a p-type heavily doped silicon dioxide wafer with 200 nm double-sided thermal oxide layer as the substrate; performing a surface treatment to the silicon dioxide wafer, wherein the surface treatment is performed by sequentially using acetone, alcohol and deionized water for ultrasonic cleaning for 15 minutes, respectively, using nitrogen gas for drying, and irradiating with ultraviolet ray for 20 minutes; placing the obtained clean silicon dioxide wafer in a spin coater and dropping 10 microliters of the solution per square centimeter on the substrate, after spin-coating at 600 revolutions per minute for 3 seconds, accelerating to 3000 revolutions per minute and then spin-coating for 40 seconds; after completing, quickly transferring the sample to a hot plate for pre-baking in air at 110° C. for 10 minutes; and then transferring to a hot plate for annealing at 400° C. in air for 60 minutes to obtain the indium gallium zinc oxide film.

(3) patterning the indium gallium zinc oxide film to obtain a patterned indium gallium zinc oxide film.

Specific method comprises steps of: patterning the indium gallium zinc oxide film to obtain a channel region of the thin film transistor by using a negative photoresist, specifically, by placing the sample in a spin coater and dropping the negative photoresist on an entire surface of the sample, after spin-coating at 700 revolutions per minute for 6 seconds, accelerating to 4000 revolutions per minute and then spin-coating for 40 seconds; and then transferring the sample to a hot plate to pre-bake in air at 150° C. for 70 seconds; after completing, transferring the sample to a lithography to mask and irradiate with ultraviolet ray for 25.3 seconds; after exposing, transferring the sample to a hot plate for first annealing at 100° C. in air for 65 seconds, and performing photoresist development for 15 seconds; after completing, wet-etching the sample by using 3.4% mass concentration of an oxalic acid aqueous solution for 10 seconds; after etching, using deionized water to clean, and sequentially using acetone and ethanol for low power ultrasonic cleaning for 10 minutes to remove the photoresist; placing the sample on a hot plate at 400° C. for second annealing in air for 60 minutes to obtain the patterned indium gallium zinc oxide film served as an active layer of the thin film transistor, which may have a thickness ranging from 20 to 30 nm.

(4) forming a source-drain electrode on the patterned indium gallium zinc oxide film to obtain the indium gallium zinc oxide thin film transistor.

Specific method comprises steps of: depositing a source-drain electrode on the patterned indium gallium zinc oxide film; aligning and attaching the sample with the patterned indium gallium zinc oxide film to a metal salt template having a pattern of the source-drain electrode; and forming an aluminum film by using a vacuum evaporation machine at a rate of 3 Å/s under $9.9 \times 10^{-4}$ pascals (Pa). The aluminum film has a thickness of 120 nm.

Example 2

The difference between this embodiment and Example 1 is that the mass concentration of the ethanolamine in the precursor solution is 6 mg/ml. Other operation steps and parameters are same as that in Example 1.

Example 3

The difference between this embodiment and Example 2 is that the molar ratio of the indium ion, the gallium ion, and the zinc ion in the precursor solution is 7:1:2. Other operation steps and parameters are same as that in Example 2.

Comparison 1

The difference between Comparison 1 and Example 1 is only that the ethanolamine is not added. Other steps and parameters are same as that in Example 1.

Comparison 2

The difference between Comparison 2 and Example 3 is only that the ethanolamine is not added. Other steps and parameters are same as that in Example 3.

The performances of thin film transistors in Example 1-3, Comparison 1, and Comparison 2 are tested, respectively. The test method adopts a three-probe test method. The source electrode is grounded, and the drain electrode and the gate electrode are connected to the source-drain voltage ($V_D$) and gate electrode voltage ($V_g$), respectively. The changes of the drain electrode current ($I_D$) under different source-drain voltages and different gate electrode voltages are recorded. By applying different source-drain voltages ($V_D$: 0.1V and 15V), in Example 1, Example 2, and Comparison 1, the test range of the gate voltages ($V_g$) is selected to be −20-20V, in Example 3 and Comparison 2, the test range of the gate voltages ($V_g$) is selected to be −40-40V, and the threshold voltage ($V_{TH}$) of the thin film transistor is calculated. The threshold voltage ($V_{TH}$) of the saturation region is fitted according to a transfer curve $I_D^{1/2}$-$V_g$ under a saturation source-drain voltage ($V_D$). When the drain electrode current ($I_D$) is 0, the intercept on the horizontal axis is the threshold voltage ($V_{TH}$) of the saturation region. The threshold voltage of the linear region is fitted according to a transfer curve $I_D$-$V_g$ under a linear source-drain voltage ($V_D$). When the drain electrode current ($I_D$) is 0, the intercept on the horizontal axis is the threshold voltage ($V_{TH}$) of the linear region.

Figure 2:
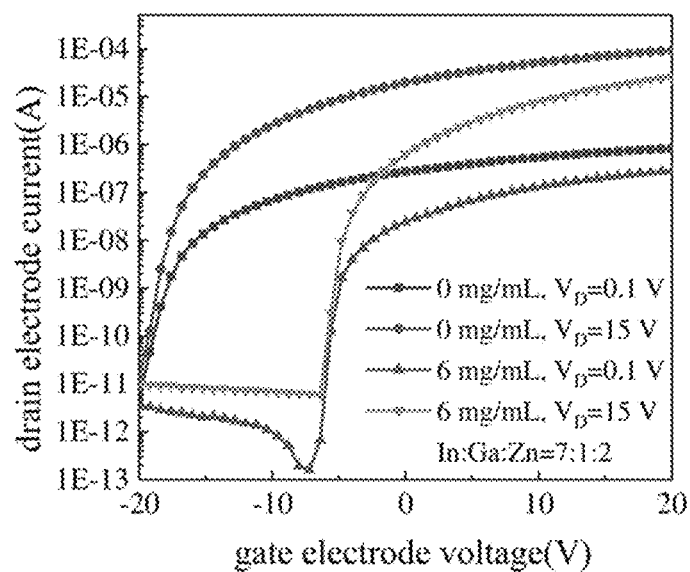
FIG. 2 is a transfer characteristic curve of an indium gallium zinc oxide thin film transistor prepared by adding different amount of ethanolamine into a mixture with a molar ratio of an indium ion, a gallium ion, and a zinc ion in the precursor solution that is 7:1:2.

The transfer characteristic curve of the indium gallium zinc oxide thin film transistors obtained from Example 1, Example 2, and Comparison 1 is shown in FIG. 1. The transfer characteristic curve of the indium gallium zinc oxide thin film transistors obtained from Example 3 and Comparison 2 is shown in FIG. 2. The differences of the electrical performance of the indium gallium zinc oxide thin film transistors obtained from Example 1-3, Comparison 1, and Comparison 2 are listed as shown in Table 1.

TABLE 1

| Number | In:Ga:Zn (molar ratio) | Ethanolamine content (mg/ml) | Working area | Threshold voltage (V) | Mobility ($cm^2V^{-1}$ $s^{-1}$) | Current on/off ratio |
| --- | --- | --- | --- | --- | --- | --- |
| Comparison 1 | 6:1:3 | 0 | Linear region ($V_D$ = 0.1 V) | −4.2 | 4.33 | $3.1 \times 10^6$ |
| | | | Saturation region ($V_D$ = 15 V) | −11.7 | 1.85 | $5.3 \times 10^6$ |
| Example 2 | | 6 | Linear region ($V_D$ = 0.1 V) | 3.1 | 1.09 | $1.4 \times 10^6$ |
| | | | Saturation region ($V_D$ = 15 V) | 1.1 | 0.73 | $2.1 \times 10^6$ |

TABLE 1-continued

| Number | In:Ga:Zn (molar ratio) | Ethanolamine content (mg/ml) | Working area | Threshold voltage (V) | Mobility ($cm^2V^{-1}s^{-1}$) | Current on/off ratio |
|---|---|---|---|---|---|---|
| Example 1 | | 18 | Linear region ($V_D = 0.1$ V) | −2.0 | 0.40 | $4.1 \times 10^4$ |
| | | | Saturation region ($V_D = 15$ V) | −0.5 | 0.76 | $1.8 \times 10^6$ |
| Comparison 2 | 7:1:2 | 0 | Linear region ($V_D = 0.1$ V) | −13.3 | 6.34 | $2.2 \times 10^5$ |
| | | | Saturation region ($V_D = 15$ V) | −19.5 | 2.31 | $8.2 \times 10^6$ |
| Example 3 | | 6 | Linear region ($V_D = 0.1$ V) | 0.9 | 4.07 | $1.8 \times 10^6$ |
| | | | Saturation region ($V_D = 15$ V) | −2.3 | 2.13 | $4.4 \times 10^6$ |

In summary, under the premise that the molar ratio of the indium ion, the gallium ion, and the zinc ion is the same, compared with the indium gallium zinc oxide thin film transistor without ethanolamine, the indium gallium zinc oxide thin film transistor with ethanolamine has a threshold voltage more closer to zero. Under the premise of adding ethanolamine, adjusting the ratio of element indium, gallium, and zinc can improve the mobility and current on/off ratio of thin film transistors, and a subthreshold swing can also be improved to a certain extent. Based on the above data, when the molar ratio of the indium ion, the gallium ion, and the zinc ion is 7:1:2, and the addition amount of ethanolamine is 6 mg/ml, the mobility is high without serious negative bias of the threshold voltage. The overall effect is improved.

The above has introduced in detail the high-performance thin film transistor based on indium gallium zinc oxide metal oxide semiconductor prepared by the present invention through application examples. In the present disclosure, the use of ethanolamine may promote the oxidation process of preparing indium gallium zinc oxide semiconductor films by using the precursor solution in the annealing process at high temperature, and reduce the oxygen vacancy concentration in the material, so as to improve negative bias of the threshold voltage in the thin film transistor. To a certain extent, a subthreshold swing and an electron mobility of the thin film transistor are also improved so that the performance of the thin film transistor is significantly improved. In addition, the manufacturing process of the thin film transistor is simple and conductive to reducing the manufacturing cost in the production applications.

It can be understood that, for those skilled in the art, there will be equivalent replacements or changes according to the technical solutions and the invention concept of this disclosure. All these changes or replacements shall belong to the protection scope of the appended claims of this disclosure.

What is claimed is:

1. A method of manufacturing an indium gallium zinc oxide thin film transistor, comprising steps of:
   (1) preparing a precursor solution of an indium gallium zinc oxide film preparing a precursor solution of an indium gallium zinc oxide film;
   (2) evenly applying the precursor solution on a substrate with a surface pretreatment, and sequentially pre-baking and annealing to obtain an indium gallium zinc oxide film;
   (3) patterning the indium gallium zinc oxide film to obtain a patterned indium gallium zinc oxide film; and
   (4) forming a source-drain electrode on the patterned indium gallium zinc oxide film to obtain the indium gallium zinc oxide thin film transistor,
   wherein the step (4) of preparing the source-drain electrode is performed by aligning and attaching a metal mask having a pattern of the source-drain electrode to the patterned indium gallium zinc oxide film, and a metal film is formed by vacuum evaporation at a rate of 2-15 Å/s under $9.9 \times 10^{-4}$ to $9.9 \times 10^{-3}$ pascals.

2. The method according to claim 1, wherein the step (1) of preparing the precursor solution comprises steps of preparing a mixture of an indium salt, a gallium salt, and a zinc salt according to a molar ratio of an indium ion, a gallium ion, and a zinc ion; adding ethanolamine into the mixture according to a mass concentration of the ethanolamine; and standing still after completely mixing.

3. The method according to claim 1, wherein the step (2) of applying is performed by spin-coating, or by dropping 10-15 microliters of the precursor solution per square centimeter on the substrate; after spin-coating at 300-700 revolutions per minute for 3-5 seconds, accelerating to 2500-4500 revolutions per minute and then spin-coating for 30-50 seconds; conditions of pre-baking are baking at 100-120° C. for 5-10 minutes; and conditions of annealing are thermal treatment at 350-500° C. for 40-60 minutes.

4. The method according to claim 1, wherein in the step (3), the patterned indium gallium zinc oxide film has a thickness ranging from 20 to 30 nm.

5. The method according to claim 1, wherein the step (3) of patterning comprises steps of evenly applying a photoresist on the indium gallium zinc oxide film, and then sequentially pre-baking, masking, exposing, first annealing, developing, etching, washing, removing the photoresist, and second annealing; wherein the step of applying is performed by spinning-coating, or by dropping the photoresist on an entire surface of the indium gallium zinc oxide film; after spin-coating at 500-700 revolutions per minutes for 4-8 seconds, accelerating to 3500-4500 revolutions per minute and then spin-coating for 35-50 seconds; conditions of pre-baking are baking at 145-150° C. for 65-75 seconds; the step of exposing is performed by irradiating under ultraviolet ray for 24-26 seconds; the time of developing is 13-18 seconds; conditions of the first annealing are thermal treatment at 90-100° C. for 60-70 seconds; and conditions of the second annealing are thermal treatment at 350-450° C. for 40-60 minutes.

6. A method of manufacturing an indium gallium zinc oxide thin film transistor, comprising steps of:
  (1) preparing a precursor solution of an indium gallium zinc oxide film preparing a precursor solution of an indium gallium zinc oxide film;
  (2) evenly applying the precursor solution on a substrate with a surface pretreatment, and sequentially pre-baking and annealing to obtain an indium gallium zinc oxide film;
  (3) patterning the indium gallium zinc oxide film to obtain a patterned indium gallium zinc oxide film; and
  (4) forming a source-drain electrode on the patterned indium gallium zinc oxide film to obtain the indium gallium zinc oxide thin film transistor,
  wherein the step (3) of patterning comprises steps of evenly applying a photoresist on the indium gallium zinc oxide film, and then sequentially pre-baking, masking, exposing, first annealing, developing, etching, washing, removing the photoresist, and second annealing; wherein the step of applying is performed by spinning-coating, or by dropping the photoresist on an entire surface of the indium gallium zinc oxide film; after spin-coating at 500-700 revolutions per minutes for 4-8 seconds, accelerating to 3500-4500 revolutions per minute and then spin-coating for 35-50 seconds; conditions of pre-baking are baking at 145-150° C. for 65-75 seconds; the step of exposing is performed by irradiating under ultraviolet ray for 24-26 seconds; the time of developing is 13-18 seconds; conditions of the first annealing are thermal treatment at 90-100° C. for 60-70 seconds; and conditions of the second annealing are thermal treatment at 350-450° C. for 40-60 minutes.

7. The method according to claim 6, wherein the step (1) of preparing the precursor solution comprises steps of preparing a mixture of an indium salt, a gallium salt, and a zinc salt according to a molar ratio of an indium ion, a gallium ion, and a zinc ion; adding ethanolamine into the mixture according to a mass concentration of the ethanolamine; and standing still after completely mixing.

8. The method according to claim 6, wherein the step (2) of applying is performed by spin-coating, or by dropping 10-15 microliters of the precursor solution per square centimeter on the substrate; after spin-coating at 300-700 revolutions per minute for 3-5 seconds, accelerating to 2500-4500 revolutions per minute and then spin-coating for 30-50 seconds; conditions of pre-baking are baking at 100-120° C. for 5-10 minutes; and conditions of annealing are thermal treatment at 350-500° C. for 40-60 minutes.

9. The method according to claim 6, wherein in the step (3), the patterned indium gallium zinc oxide film has a thickness ranging from 20 to 30 nm.

* * * * *